United States Patent [19]

Lissalde et al.

[11] 4,453,129

[45] Jun. 5, 1984

[54] METHOD FOR MEASURING THE CHARGE STATE OF AN ACCUMULATOR AND A DEVICE FOR IMPLEMENTING SUCH METHOD

[75] Inventors: François-Claude Lissalde, Seyssins; Jacques Esteve, Annecy, both of France

[73] Assignee: Cristec Industries, Annecy, France

[21] Appl. No.: 300,127

[22] PCT Filed: Jan. 12, 1981

[86] PCT No.: PCT/FR81/00004
§ 371 Date: Sep. 4, 1981
§ 102(e) Date: Sep. 4, 1981

[87] PCT Pub. No.: WO81/02066
PCT Pub. Date: Jul. 23, 1981

[30] Foreign Application Priority Data

Jan. 14, 1980 [FR] France ................. 80 00951

[51] Int. Cl.³ .......................................... G01N 27/46
[52] U.S. Cl. ................................. 324/429; 324/426
[58] Field of Search .......................... 324/425–429, 324/433; 320/48

[56] References Cited

U.S. PATENT DOCUMENTS 4,021,718  5/1977  Konrad ............................ 320/48
4,321,541  3/1982  Nishizuka ........................ 324/426

OTHER PUBLICATIONS

M. B. Weinstein et al., "Guard Your Battery with PM's Charge Checker", Popular Mechanics, vol. 151, No. 5, May 1979, pp. 84, 86 and 264.

Primary Examiner—Michael J. Tokar
Attorney, Agent, or Firm—Roland Plottel

[57] ABSTRACT

The present invention provides a method for measuring the charge state of an accumulator and a device for implementing such method.

The method consists in measuring the temporary voltage drop at the terminals of the accumulator during delivery of a high current. The device for measuring this maximum voltage drop comprises a first maximum detector (43) supplying a voltmeter (42) and connected to the output terminal of a subtractor (44) whose so-called inverting input is connected to the accumulator through a filter (45) and whose so-called non inverting input is connected to the accumulator through a second maximum detector (46).

Application to measuring the charge state of an accumulator.

10 Claims, 4 Drawing Figures

METHOD FOR MEASURING THE CHARGE STATE OF AN ACCUMULATOR AND A DEVICE FOR IMPLEMENTING SUCH METHOD

The present invention relates to a method for measuring the charge state of an accumulator subjected to heavy transitory consumptions by measuring a temporary voltage drop at the terminals thereof, and a device for implementing such method.

It is current practice, when using accumulators for example electric storage batteries, to try to get to know their charge or discharge state so as to determine the time during which they may still operate. Different methods are known for determining this charge state more or less rapidly and more or less accurately : one precise method consists in determining the density of the electrolyte contained in the accumulator. This method is however difficult to implement and inconvenient in use. Generally a second method is used which consists in measuring by means of a voltmeter the voltage of the terminals of the accumulator in the absence of charge or discharge current. FIG. 1 is a diagram showing the variation of this off-load voltage at the terminals of the accumulator depending on the discharge state of this accumulator. Such voltage decreases first of all rapidly, then levels off and finally decreases rapidly at the end of discharge. It has been noticed that the ability of an accumulator to restore the maximum energy stored up depends on the discharge mode. A discharge in a short time restores a smaller amount of energy than a slow discharge. There is shown in the Figure a first curve reaching point A to illustrate a slow discharge and a second curve reaching point A' to illustrate a rapid discharge. Conventional voltmeters showing the off-load voltage are limited to giving the moment when this latter reaches point A or A' shown in the diagram, indicating that the voltage drops rapidly and that the accumulator must be recharged. A third method consists in measuring the dynamic resistance of the accumulator : this method is used when the accumulator feeds into a useful load which cannot be disconnected ; the dynamic resistance of the accumulator is assessed by connecting for a short time an additional auxiliary load, producing an additional current flow and a voltage drop at the terminals of the accumulator the measurement of which allows this resistance to be calculated. The auxiliary load is connected for a short time so as to avoid unnecessary discharge of the accumulator. Experimental studies have enabled a limit value of this resistance to be determined from which the accumulator should be recharged. These last two methods have the advantage of being relatively simple and rapid to put into use, but do not give sufficient indication when it is desired to know sufficiently long in advance that the accumulator is reaching the end of discharge. Thus, when this accumulator is used for delivering a heavy transitory consumption device at start-up such as an electric motor driving a load with great inertia and/or with high friction on start, particularly when starting up an internal combustion engine, it is necessary to know if the accumulator will be able to start up the engine at least once. Now, when the voltmeter of the second method indicates that point A or A' on the diagram has been reached, it is already too late and there is every chance that the engine cannot be started.

Similarly, the substantial variation of the dynamic resistance of the accumulator only occurs when the vicinity of point A or A' on the diagram has been reached and the method does not allow the end of discharge of the accumulator to be forecast sufficiently long in advance in the case of application thereof to starting up an electric motor. In fact, in the case of heavy transitory drains from the accumulator, the discharge is sometimes slow, sometimes rapid and passes gradually from the first curve to the second curve of FIG. 1. These phenomena are not linear, so that forecasting them is not possible by simply measuring linear effects such as the dynamic resistance. The non-linear phenomena accompanying the high value transitory discharges must on the contrary be integrated.

It will be noted in the description which follows and in the claims that there is designated by electric motor, so as to simplify the explanation, any type of heavy transitory consumption load on start-up, the start-up consumption representing a high fraction of the capacity of the accumulator.

An object of the present invention is to provide a method for measuring the charge state of an accumulator for indicating sufficiently long in advance the need to recharge the accumulator. Thus, with this method it is known that the accumulator will have to be recharged but that an engine may still be started once or more times.

Another object of the present invention is to provide a device for implementing this method by measuring the temporary maximum voltage drop at the terminals of the accumulator at the time of starting up the engine.

Another object of the present invention is to provide a circuit both simple and economic for carrying out these measurements.

For this, and according to one aspect of the present invention, the method of measuring the charge state of an accumulator consists in storing the voltage at the terminals of the accumulator before connection of the electric motor, detecting after each connection of the motor the temporary maximum voltage drop at the terminals of the accumulator, storing and displaying the result of such detection. The comparison of this maximum voltage drop value with a reference value allows the user to determine the need for recharging the accumulator. This method of measurement, contrary to the known methods, allows all the non linear phenomena producing a voltage drop during operation of the accumulator on the useful load for which it is intended to be integrated. It further allows, for forecasting the recharge of the accumulator, the nature of the load connected to the terminals of the accumulator to be taken into account. In fact, in the case of successive start-ups of electric motors supplied by the accumulator, the intensity of the current supplied is very great and the capacity decreases very quickly, all the more quickly the greater the intensity. With the method of the present invention, contrary to known methods, the actual current fed into the load and non linear phenomena accompanying the delivery of a large fraction of the capacity of the accumulator at each start-up may be taken into account simply and efficiently so as to forecast its residual capacity ; the method thus allows a sufficiently reliable and long forecast to be obtained in the case of delivery to an electric motor, which is an essentially variable load. It will also be noted that the term "maximum voltage drop" should be understood as the voltage drop from which transitory parasite phenomena have been eliminated such as the over-oscillations due particularly to the inductive nature of electric motors.

According to another aspect of the present invention, the device for measuring the charge state of an accumulator comprises maximum voltage drop detection and storage means and display means for displaying the result of the detection or the result of the comparison of such detection with a reference signal. The means for displaying the result of the detection, which provide a continuous or analog type of storage, allow the operator to interpret the results so as to assess the need for recharge, by integrating more especially temperature, for example meteorological, forecasts, likely to influence the future behaviour of the load.

According to another feature of the present invention, the means for detecting and storing the maximum voltage drop comprise a first maximum detector circuit for detecting and storing the maximum voltage of the accumulator, a subtractor circuit for providing the difference between this maximum voltage and the instantaneous voltage of the accumulator, and a second maximum detector circuit for detecting and storing the maximum of this difference : a low-pass filter removes from the instantaneous voltage of the accumulator the transitory parasite oscillations.

According to another one of its aspects, the present invention provides a device for monitoring the charge state of an accumulator by combining the preceding method of measuring the maximum voltage drop when an electric motor is connected to the terminals of the accumulator and the method for measuring the off-load voltage of the accumulator. For that, the device further comprises means for measuring the off-load voltage of the accumulator and inverting and zero shift means for enabling the result of this measurement to be displayed by the same display means as the first method.

These objects, aspects and advantages as well as others of the present invention will be discussed in more detail in the following description of particular embodiments made with reference to the accompanying figures in which.

Figure 2:
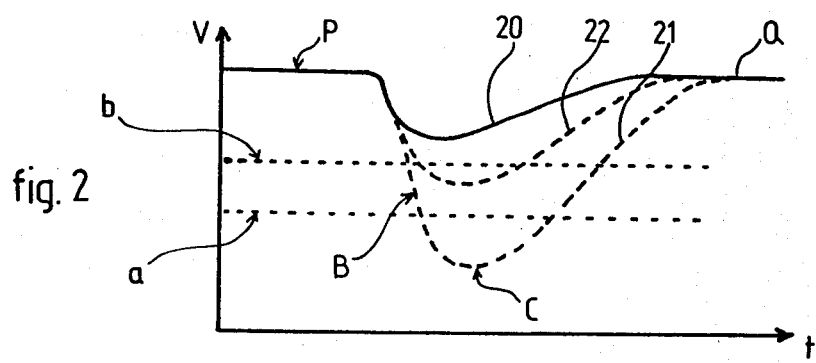
FIG. 2 shows wave-forms for illustrating the measuring method of the present invention.

FIG. 2 is a time diagram of the voltage at the terminals of the accumulator during the measurement. The accumulator is first of all off load, the current delivered being substantially zero. The voltage at these terminals is at a high and constant level shown by the level portion P. Then the electric motor is connected to the terminals of the accumulator which then delivers a current. That causes a voltage drop at the terminals of the accumulator, represented by the downward portion B of the curve. After start-up of the motor, the current delivered decreases and the motor is possibly disconnected. The voltage rises gradually from the minimum C up to a level portion Q substantially at the same level as portion P. The minimum C reached depends on the current delivered by the accumulator and the charge state thereof. The continuous line curve 20 shows a form of voltage drop for a well charged accumulator, under certain delivery conditions. The broken line curve 21 shows a form of voltage drop for an insufficiently charged accumulator, under the same delivery conditions, the minimum of the curve being less than the minimum admissible voltage represented by the straight broken line a. Curve 22 shows the voltage drop for an accumulator whose charge becomes almost insufficient, the minimum being within a voltage zone, called dangerous zone, represented between the straight broken lines a and b. The method of the present invention consists in detecting and measuring the voltage of this minimum, and displaying the result so as to cause the accumulator to be recharged as soon as this minimum reaches the dangerous zone.

So as to take into account the actual conditions of use of the accumulator and the needs of the load for normal operation, the dangerous zone represented between curves a and b will have to be determined by calibration by causing the accumulator to deliver into the motor for successive periods of time until insufficient operation of the motor is obtained. Then the voltage drop measured during the last start-up is taken and the dangerous zone deduced therefrom.

Figure 3:
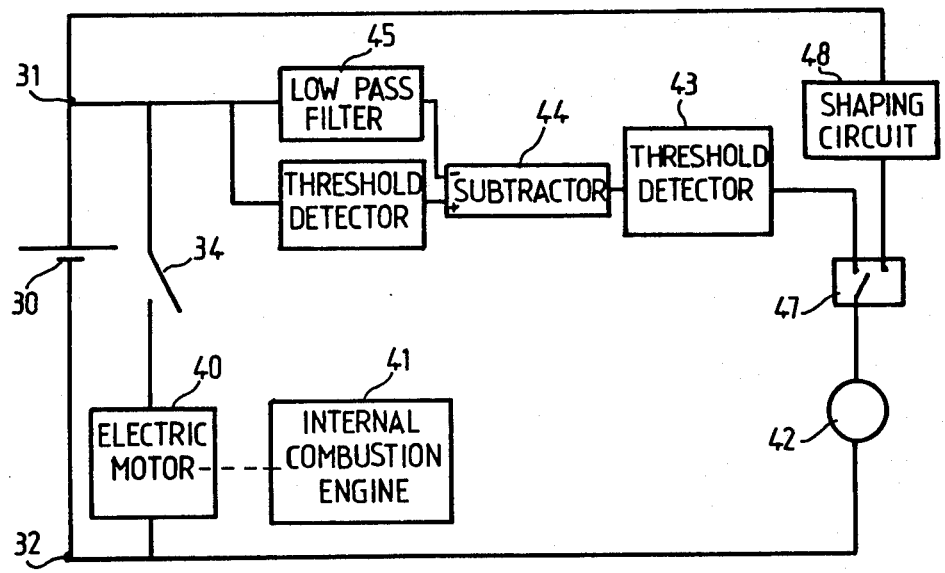
FIG. 3 shows the main parts of the device of the present invention.

FIG. 3 shows schematically the circuit used for implementing this method : between the positive terminal 31 and the negative terminal 32 of accumulator 30 are connected, on the one hand, the load impedance formed by the motor 40 in series with a switch 34 and, on the other hand, a circuit for detecting the maximum voltage drop. The method of the present invention consists in detecting the maximum voltage drop at the terminals of the accumulator each time switch 34 is closed for starting up motor 40.

In the FIG., electric motor 40 is shown coupled mechanically to an internal combustion engine 41. The electric motor is used as a starter motor for the internal combustion engine. On start-up of the combustion engine, the device of the present invention effects a measurement which lasts during the whole start-up phase of the engine, the rising zone of the voltage curve shown in FIG. 2 having a form which depends on different physical parameters, such as the inertia of the combustion engine or its temperature. The minimum voltage of zone C only depends on the electric parameters of the load impedance and the state of the accumulator, this state depending on the current delivered to the motor.

There is shown schematically in FIG. 3 one embodiment of the maximum voltage drop detector in accordance with the present invention. This detector comprises, for displaying the result of the measurement, a voltmeter 42 one terminal of which is connected to the negative terminal of the accumulator 30, and the other terminal of which is connected to the output terminal of a threshhold detector circuit 43 sometimes is known under the name of "maximum detector". The input terminal of the detector 43 is connected to the output terminal of a circuit 44 whose usual function is known under the name of "subtractor", a first input terminal of which, called inverting terminal, is connected to the positive terminal of the accumulator 30 through a low-pass filter 45 and a second input terminal of which, called non inverting terminal, is connected to the output terminal of a second threshhold detector or maximum detector 46. The input terminal of this second maximum detector 46 is connected to the terminal 31 of the accumulator.

The two maximum detectors have the following function: when a variable voltage is applied to their input terminal, the voltage at their output terminal is equal to the maximum reached by the input voltage. This output voltage is stored by the circuit and remains substantially constant during a predetermined period of time. The function of circuit 44 is to produce at its output terminal a voltage equal to the sum of the voltage present at its non inverting input terminal and the reverse of the voltage present at its inverting input terminal. This circuit provides then the difference between these two voltages. The filter 45 is a low-pass filter for preventing the too abrupt variations of the input voltage, due to rapid variations of the impedance of motor 40, from being taken into account. It is preferable to use an analog type filter so as to obtain efficient filtering despite the substantial variations of a load such as an electric motor.

Figure 4:
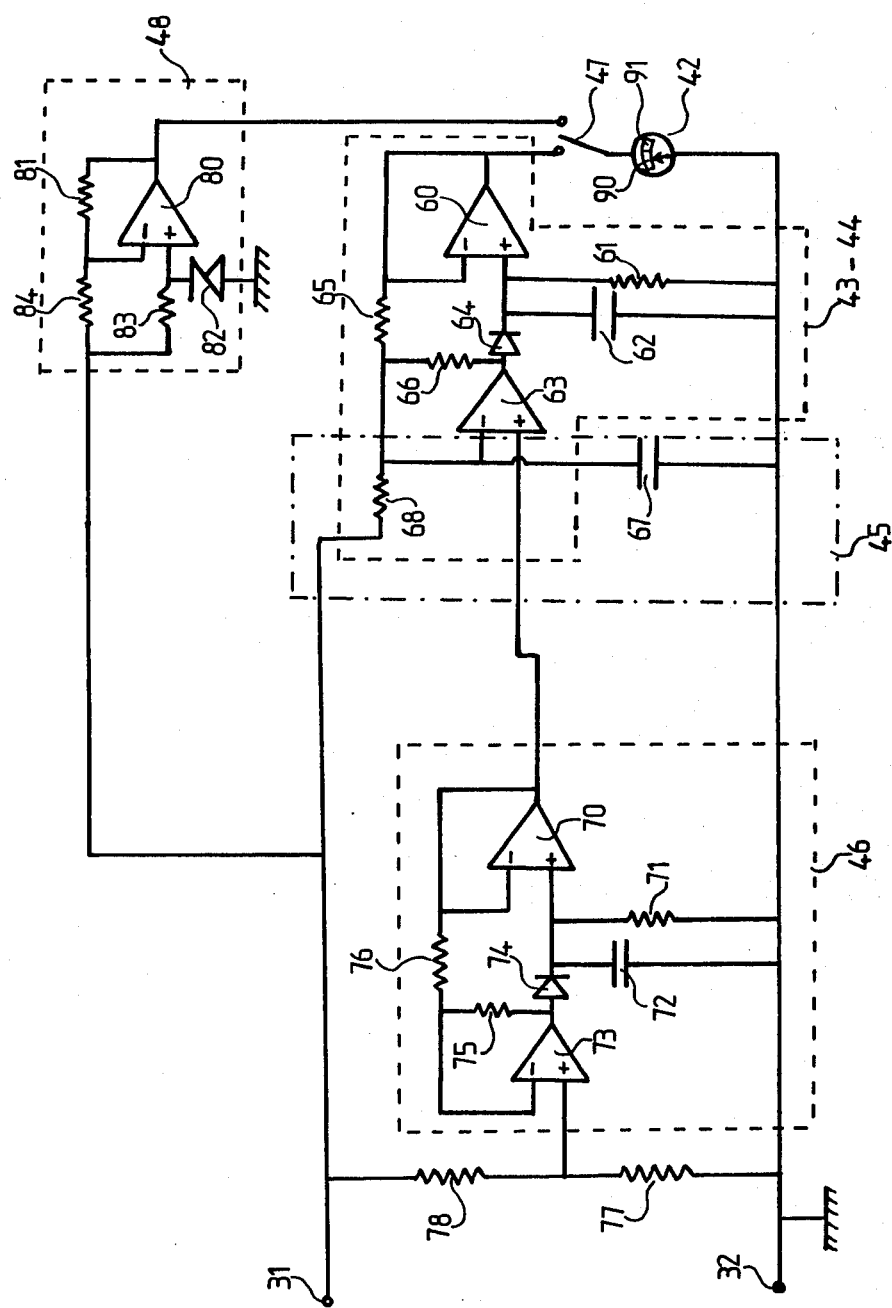
FIG. 4 shows the circuit of one practical embodiment of the device of the present invention.

To combine the assessment method by measuring the off-load voltage of the accumulator and the assessment method by measuring the maximum voltage drop during start-up of the motor, the device further comprises switching means for selectively switching voltmeter 42 now to the output terminal of detector 43 and now to the output terminal of the shaping circuit 48 whose input terminal is connected to terminal 31 of the accumulator. The first function of the shaping circuit 48 is to invert the instantaneous voltage measured at the terminals of accumulator 30, and its second function is to shift the voltage obtained by a constant value so as to allow voltmeter 42 to be used in two measuring modes, the needle of the voltmeter moving in the same areas defining a correct operation zone, a dangerous zone and an inadequate operation zone. In FIG. 4 there is shown one embodiment of the circuit of the present invention, comprising the main elements of the circuit of FIG. 3 and giving an embodiment of the different elements thereof : a filter, maximum detector, subtractor, switch and shaping circuit. Voltmeter 42 has a first terminal connected to the negative terminal 32 of the accumulator, which we will call in what follows reference terminal and a second terminal connected to the output terminal of the switching means 47. The switching means 47 have an input terminal connected to the output terminal of a first operational amplifier 60, whose inverting input terminal is connected to its output terminal. The non inverting input terminal of amplifier 60 is connected to reference terminal 32 through a resistor 61 and a capacitor 62 connected in parallel, and to the cathode of a diode 64 whose anode is connected to the output terminal of a second operational amplifier 63. The inverting input terminal of amplifier 63 is connected to the inverting input terminal of amplifier 60 through a resistor 65, and to the output terminal of amplifier 63 through a resistor 66, and to the terminal 31 of the accumulator through a resistor 68 and to the reference terminal 32 through a capacitor 67. The non inverting input terminal of amplifier 63 is connected to the output terminal of a third operational amplifier 70 whose inverting input terminal is connected, on the one hand, to its output terminal and, on the other hand, to the inverting input terminal of a fourth operational amplifier 73 through a resistor 76. The non inverting input terminal of amplifier 70 is connected to the reference terminal 32 through a resistor 71 and a capacitor 72 connected in parallel, and to the cathode of a diode 74 whose anode is connected to the output terminal of amplifier 73. The inverting input terminal of amplifier 73 is further connected to its output terminal through a resistor 75. The non inverting input terminal of amplifier 73 is connected to the reference terminal 32 through a resistor 77 and to the terminal 31 of the accumulator through a resistor 78.

The function of switching means 47 is to selectively switch its output terminal with one of its two input terminals. The second input terminal of switch 47 is connected to the output terminal of an operational amplifier 80 whose inverting input terminal is connected to the terminal 31 of the accumulator through a resistor 84 and to the output terminal of amplifier 80 through a resistor 81. The non inverting input terminal of amplifier 80 is connected, on the one hand, to terminal 31 of the accumulator through a resistor 83 and, on the other hand, to the cathode of a Zener diode 82 whose anode is connected to the reference terminal 32. Switch 47 may be synchronized with the start-up, more especially by detecting the voltage difference at the input and at the output of the storage means 46.

In FIG. 4 there is shown with broken lines the different units forming the elements shown in FIG. 3. Thus, the first maximum detector 43 comprises operational amplifiers 60 and 63, resistor 61, capacitor 62 and diode 64. The second maximum detector 46 comprises the same elements, i.e. amplifiers 70 and 73, resistor 71, capacitor 72 and diode 74. The subtraction function of circuit 44 is provided, in this embodiment, by the whole of the elements of detector 43. Filter 45 comprises capacitor 67 and resistor 68. The shaping circuit 48 comprises amplifier 80, resistors 81, 83 and 84 and Zener diode 82.

Preferably, resistors 68 and 78 will have the same value and resistors 65 and 77 the same value. A resistor 68 will have a value five to ten times greater than the value of resistor 65, so that the input and output voltages of the amplifiers remain small with respect to the supply voltage. Thus, because of the rejection qualities of the amplifiers with respect to supply voltage variations, the accuracy of operation of the unit is guaranteed down to very low supply voltages supplied by the accumulator.

The operation of the circuit is the following : under established working conditions, i.e. when the voltage of the accumulator is constant, the maximum detector 46 delivers at its output terminal a voltage equal to a fraction of the voltage at the terminals of the accumulator, which fraction is determined by the resistors 77 and 78. The second maximum detector 43 detects no voltage difference between the output voltage of the first detector 46 and the terminal 31 of the accumulator, so that its output terminal supplies zero voltage depending on the choice of the values of resistors 65, 68, 77 and 78 mentioned above. When the switching means 47 connects voltmeter 42 to the output terminal of amplifier 60, this voltmeter indicates a zero voltage, its needle being disposed in an area 90 of the dial indicating a sufficient charge of the accumulator.

When the voltage of the accumulator drops abruptly, particularly under the action of the current delivered to the motor at the time of connection thereof to the terminals of the accumulator, this voltage drop is transmitted, on the one hand, to the input of maximum detector 46 and, on the other hand, through filter 45 to the input of amplifier 63. Diode 74 is then reversely biassed, preventing discharge of capacitor 72, so that the output voltage of amplifier 70 remains substantially constant for a period of time determined by the discharge time of this capacitor through resistor 71. Thus, the voltage which the accumulator had before connection of the load impedance is stored. The maximum detector 43 then detects a voltage difference, causing the increase of the voltage at the terminals of capacitor 62. As soon as the voltage at the terminals of the accumulator again increases, diode 64 is reversely biassed and prevents the discharge of capacitor 62, so that the output terminal of amplifier 60 supplies a voltage equal to the maximum voltage drop of the accumulator, for the time that capacitor 62 discharges into resistor 61. Thus, there is stored in memory, for a certain length of time, the maximum voltage drop of the accumulator. The needle of voltmeter 42 indicates the value of this maximum voltage drop and, if this latter is substantial, the needle of the voltmeter may penetrate into a zone 91 of the dial, called dangerous zone.

The time constant of the circuit formed by capacitor 72 and resistor 71 is chosen so that the voltage drop at the output of amplifier 70 during the testing period is negligible, but so that the storage circuit 46 follows the slow voltage variations of the accumulator.

The time constant of the circuit formed by capacitor 62 and resistor 61 is chosen fairly long so as to allow the operator to read the transitory voltage loss of the accumulator.

Figure 1:
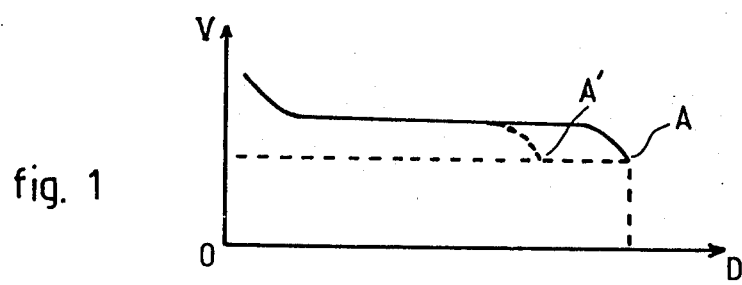
FIG. 1 is for illustrating the method for determining the charge state of an accumulator by measuring the off-load voltage.

The device of the present invention allows furthermore the state of charge of the accumulator to be monitored in the absence of start-up of motor 40. For that, the switching means 47 connects voltmeter 42 to the output of the shaping means 48. This shaping means allows a voltmeter with zero suppression to be formed, whose deflection direction has been chosen so as to be compatible with that of the previously described maximum detector. Thus, when the voltage of the accumulator reaches point A in the diagram of FIG. 1, the needle of the voltmeter reaches zone 91, whereas this voltage is higher, the needle remains in zone 90.

Voltmeter 42 may be of analog type and comprise marks for defining the dangerous area and the area of correct operation. A display means different from the digital or analog voltmeter may also be envisaged : the voltage drop detected by the previously described device is compared with one or several reference voltages by a comparator, not shown in the figures, the signal supplied by the comparator being transmitted in binary form to one or more indicator lamps or to a sound signal generator for warning the user of the need to recharge the accumulator.

The present invention is very generally applicable to measuring the charge state of all types of accumulators whose voltage decreases progressively during discharge and particularly lead accumulators and cadmium nickel accumulators.

The present invention is not limited to the embodiments which have been explicitly described, but it includes the different variations and generalizations contained within the scope of the following claims.

We claim:

1. A method for measuring the charge state of an electric storage battery intended to be connected to an electric starting motor for an internal combustion engine, comprising the steps of:
   measuring and storing the voltage at the terminals of the battery before connection to the motor;
   detecting during each connection of the motor the temporary maximum voltage drop at the terminals of the battery;
   storing the result of the detection; and
   displaying the result of this detection.

2. The method according to claim 1, wherein the display step comprises the following phases:
   comparing the result of the detection with a reference signal determined during preliminary tests for defining the limit of correct operation of the motor; and
   displaying the result of the comparison.

3. A device for measuring the state charge of an electric storage battery intended to be connected to an electric starting motor, comprising:
   means (46) for measuring and storing the voltage at the terminals of the battery before connection to the motor;
   means (34) for connecting the battery to the motor (40) and means (43, 44, 45, 46) for detecting the maximum temporary filtered voltage drop at the terminals of the battery;
   means (43) for storing the result of the detection; and
   means (42) for displaying the result of this detection.

4. The device according to claim 3, wherein the means (42) for displaying the result comprise a means for producing a reference signal (90, 91) a comparator for comparing the result of the detection with the reference signal, and a means for displaying the result given by the comparator.

5. The device according to any one of claims 3 or 4, wherein the means for detecting and storing the maximum voltage drop comprise
   a first threshold detector circuit (46) for detecting and storing the voltage maximum at the terminals of the battery;
   a subtractor circuit (44) for effecting the difference between the voltage maximum at the terminals of the battery supplied by the threshold detector circuit (46) and the instantaneous voltage at the terminals of this battery; and
   a second circuit (43) for detecting and storing the voltage maxium supplied by the circuit.

6. The device according to claim 3, wherein a low-pass filter (45) is inserted between a terminal of the battery and the corresponding input terminal of the subtractor circuit 44.

7. The device according to claim 3, further comprising switching means (47) for selectively connecting the display means (42) either to the maximum voltage drop detection device, or to means (48) for measuring and shaping the permanent voltage at the terminals of the battery.

8. The device according to claim 7, wherein the measuring and shaping means (48) is an inverter and zero shift circuit, producing on the display means (42) a variation direction and amplitude compatible with those produced by the voltage drop detector.

9. The device according to claim 5, wherein the maximum detector circuits comprise a capacitor (72) connected in parallel across a high value resistor (71), a terminal of the capacitor being connected to a terminal (32) of the battery, the other terminal of the capacitor being connected to the output terminal of an operational amplifier (73) through a diode (74), and to the inverting input terminal of this operational amplifier.

10. The device according to claim 3, wherein the means for displaying the result is a voltmeter (42) whose dial comprises marks for defining at least one correct operation area (90) and a dangerous area (91).

* * * * *